(12) United States Patent
Terrill et al.

(10) Patent No.: US 9,577,089 B2
(45) Date of Patent: Feb. 21, 2017

(54) STRUCTURES AND METHODS OF FABRICATING DUAL GATE DEVICES

(75) Inventors: Kyle Terrill, Santa Clara, CA (US); Yuming Bai, Union City, CA (US); Deva Pattanayak, Saratoga, CA (US); Zhiyun Luo, San Jose, CA (US)

(73) Assignee: Vishay-Siliconix, Santa Clara, CA (US)

( * ) Notice: Subject to any disclaimer, the term of this patent is extended or adjusted under 35 U.S.C. 154(b) by 458 days.

(21) Appl. No.: 13/039,089

(22) Filed: Mar. 2, 2011
(Under 37 CFR 1.47)

(65) Prior Publication Data
US 2011/0254084 A1   Oct. 20, 2011

Related U.S. Application Data

(60) Provisional application No. 61/309,824, filed on Mar. 2, 2010.

(51) Int. Cl.
| | | |
|---|---|---|
| H01L 21/76 | (2006.01) | |
| H01L 29/78 | (2006.01) | |
| H01L 29/40 | (2006.01) | |
| H01L 29/66 | (2006.01) | |
| H01L 29/417 | (2006.01) | |
| H01L 29/423 | (2006.01) | |

(52) U.S. Cl.
CPC ......... *H01L 29/7813* (2013.01); *H01L 29/407* (2013.01); *H01L 29/66734* (2013.01); *H01L 29/41741* (2013.01); *H01L 29/4238* (2013.01)

(58) Field of Classification Search
CPC ............. H01L 29/407; H01L 29/41741; H01L 29/4238; H01L 29/66734

USPC .... 438/424, 400, 270, 589; 257/330, E21.54
See application file for complete search history.

(56) References Cited

U.S. PATENT DOCUMENTS

| | | |
|---|---|---|
| 4,710,790 A | 12/1987 | Okamoto et al. |
| 4,881,105 A | 11/1989 | Davari et al. |
| 5,283,201 A | 2/1994 | Tsang et al. |
| 5,321,289 A | 6/1994 | Baba et al. |
| 5,477,071 A | 12/1995 | Hamamoto et al. |
| 5,502,320 A | 3/1996 | Yamada |

(Continued)

FOREIGN PATENT DOCUMENTS

| | | |
|---|---|---|
| DE | 102005041322 | 3/2007 |
| EP | 0717450 A | 6/1996 |

(Continued)

OTHER PUBLICATIONS

Hsu et al., "A Novel Trench Termination Design for 100-V TMBS Diode Application", IEEE Electron Device Letters, vol. 22 No. 11, Nov. 2001, pp. 551-552.

(Continued)

*Primary Examiner* — Ori Nadav

(57) ABSTRACT

First polysilicon (poly-1) is deposited into deep trenches that have been formed in a substrate. A first polysilicon polishing process is performed to planarize the exposed surfaces of the poly-1 so that the surfaces are flush with adjacent surfaces. Then, shallow trenches are formed in the substrate between the deep trenches, and second polysilicon (poly-2) is deposited into the shallow trenches. A second polysilicon polishing process is performed to planarize the exposed surface of the poly-2 so that the surface is flush with adjacent surfaces. Metal contacts to the poly-1 and the poly-2 are then formed.

17 Claims, 10 Drawing Sheets

(56) References Cited

U.S. PATENT DOCUMENTS

| | | |
|---|---|---|
| 5,614,751 A | 3/1997 | Yilmaz et al. |
| 5,637,898 A | 6/1997 | Baliga |
| 5,668,026 A | 9/1997 | Lin et al. |
| 5,726,463 A | 3/1998 | Brown et al. |
| 5,763,915 A | 6/1998 | Hshieh et al. |
| 5,864,159 A | 1/1999 | Takahashi |
| 5,877,528 A | 3/1999 | So |
| 5,914,503 A | 6/1999 | Iwamuro et al. |
| 5,998,833 A | 12/1999 | Baliga |
| 6,031,265 A | 2/2000 | Hshieh |
| 6,084,264 A | 7/2000 | Darwish |
| 6,211,549 B1 | 4/2001 | Funaki et al. |
| 6,242,775 B1 | 6/2001 | Noble |
| 6,255,683 B1 | 7/2001 | Radens et al. |
| 6,281,547 B1 * | 8/2001 | So et al. ............... 257/330 |
| 6,291,298 B1 | 9/2001 | Williams et al. |
| 6,309,929 B1 | 10/2001 | Hsu et al. |
| 6,404,007 B1 | 6/2002 | Mo et al. |
| 6,413,822 B2 | 7/2002 | Williams et al. |
| 6,462,376 B1 | 10/2002 | Wahl et al. |
| 6,489,204 B1 | 12/2002 | Tsui |
| 6,495,884 B2 | 12/2002 | Harada et al. |
| 6,525,373 B1 | 2/2003 | Kim |
| 6,545,315 B2 | 4/2003 | Hshieh et al. |
| 6,548,860 B1 | 4/2003 | Hshieh et al. |
| 6,621,107 B2 | 9/2003 | Blanchard et al. |
| 6,653,691 B2 | 11/2003 | Baliga |
| 6,683,346 B2 | 1/2004 | Zeng |
| 6,707,128 B2 | 3/2004 | Moriguchi et al. |
| 6,781,199 B2 | 8/2004 | Takahashi |
| 6,838,722 B2 | 1/2005 | Bhalla et al. |
| 6,882,000 B2 | 4/2005 | Darwish et al. |
| 6,900,100 B2 | 5/2005 | Williams et al. |
| 6,906,380 B1 | 6/2005 | Pattanayak et al. |
| 6,921,697 B2 | 7/2005 | Darwish et al. |
| 7,005,347 B1 | 2/2006 | Bhalla et al. |
| 7,009,247 B2 | 3/2006 | Darwish |
| 7,335,946 B1 | 2/2008 | Bhalla et al. |
| 7,345,342 B2 | 3/2008 | Challa et al. |
| 7,385,248 B2 | 6/2008 | Herrick et al. |
| 7,393,749 B2 | 7/2008 | Yilmaz et al. |
| 7,494,876 B1 | 2/2009 | Giles et al. |
| 7,544,571 B2 | 6/2009 | Park |
| 7,598,143 B2 | 10/2009 | Zundel et al. |
| 7,868,381 B1 | 1/2011 | Bhalla et al. |
| 7,936,009 B2 | 5/2011 | Pan et al. |
| 8,247,865 B2 | 8/2012 | Hirler |
| 8,629,505 B2 | 1/2014 | Nishiwaki |
| 8,686,493 B2 | 4/2014 | Thorup et al. |
| 2002/0036319 A1 | 3/2002 | Baliga |
| 2002/0056884 A1 | 5/2002 | Baliga |
| 2003/0086296 A1 | 5/2003 | Wu et al. |
| 2003/0178676 A1 | 9/2003 | Henninger et al. |
| 2003/0201502 A1 | 10/2003 | Hsieh |
| 2004/0021173 A1 | 2/2004 | Sapp |
| 2004/0038479 A1 | 2/2004 | Hsieh |
| 2004/0084721 A1 | 5/2004 | Kocon et al. |
| 2004/0113202 A1 | 6/2004 | Kocon et al. |
| 2005/0001268 A1 | 1/2005 | Baliga |
| 2005/0079676 A1 | 4/2005 | Mo et al. |
| 2005/0082591 A1 | 4/2005 | Hirler et al. |
| 2005/0151190 A1 | 7/2005 | Kolek et al. |
| 2005/0167742 A1 | 8/2005 | Challa et al. |
| 2006/0017056 A1 | 1/2006 | Hirler |
| 2006/0113577 A1 | 6/2006 | Ohtani |
| 2006/0209887 A1 | 9/2006 | Bhalla et al. |
| 2006/0214221 A1 | 9/2006 | Challa et al. |
| 2006/0273386 A1 | 12/2006 | Yilmaz et al. |
| 2006/0281249 A1 | 12/2006 | Yilmaz et al. |
| 2007/0004116 A1 | 1/2007 | Hshieh |
| 2007/0037327 A1 | 2/2007 | Herrick et al. |
| 2007/0108511 A1 | 5/2007 | Hirler |
| 2007/0108515 A1 | 5/2007 | Hueting et al. |
| 2007/0132014 A1 | 6/2007 | Hueting |
| 2007/0155104 A1 | 7/2007 | Marchant et al. |
| 2007/0221952 A1 | 9/2007 | Thorup et al. |
| 2008/0073707 A1 | 3/2008 | Darwish |
| 2008/0076222 A1 | 3/2008 | Zundel et al. |
| 2008/0135889 A1 | 6/2008 | Session |
| 2008/0166845 A1 | 7/2008 | Darwish |
| 2008/0197407 A1 | 8/2008 | Challa et al. |
| 2008/0199997 A1 | 8/2008 | Grebs et al. |
| 2008/0265289 A1 | 10/2008 | Bhalla et al. |
| 2009/0035900 A1 | 2/2009 | Thorup et al. |
| 2009/0050959 A1 | 2/2009 | Madson |
| 2009/0057756 A1 | 3/2009 | Hshieh |
| 2009/0072301 A1 | 3/2009 | Bhalla et al. |
| 2009/0140327 A1 | 6/2009 | Hirao et al. |
| 2009/0162989 A1 | 6/2009 | Cho et al. |
| 2009/0200578 A1 | 8/2009 | Xu |
| 2009/0246923 A1 | 10/2009 | Park |
| 2009/0273026 A1 | 11/2009 | Wilson et al. |
| 2009/0309156 A1 | 12/2009 | Darwish et al. |
| 2010/0006928 A1 | 1/2010 | Pan et al. |
| 2011/0079843 A1 | 4/2011 | Darwish et al. |
| 2011/0089485 A1 | 4/2011 | Gao et al. |
| 2012/0043602 A1 | 2/2012 | Zeng et al. |
| 2012/0061753 A1 | 3/2012 | Nishiwaki |
| 2012/0267704 A1 | 10/2012 | Siemieniec et al. |
| 2013/0049072 A1 | 2/2013 | Heineck et al. |
| 2013/0221436 A1 | 8/2013 | Hossain et al. |

FOREIGN PATENT DOCUMENTS

| | | |
|---|---|---|
| JP | 63296282 | 2/1988 |
| JP | H03-211885 | 1/1990 |
| JP | 03211885 | 9/1991 |
| JP | H07-045817 | 2/1995 |
| JP | H07-235676 | 9/1995 |
| JP | H08-167711 | 6/1996 |
| JP | 10173175 | 6/1998 |
| JP | 11068102 | 3/1999 |
| JP | 2000223705 | 8/2000 |
| JP | 2001308327 | 11/2001 |
| JP | 2002110984 | 4/2002 |
| JP | 2003282870 | 10/2003 |
| JP | 2003309263 | 10/2003 |
| JP | 2004241413 | 8/2004 |
| JP | 2005032941 | 2/2005 |
| JP | 2005057050 | 3/2005 |
| JP | 2005191221 | 7/2005 |
| JP | 2006202931 | 8/2006 |
| JP | 2007529115 | 10/2007 |
| JP | 2008543046 | 11/2008 |
| JP | 2008546189 | 12/2008 |
| JP | 2008546216 | 12/2008 |
| JP | 2009505403 | 2/2009 |
| JP | 2009141005 | 6/2009 |
| JP | 2009542002 | 11/2009 |
| JP | 2010505270 | 2/2010 |
| JP | 2011258834 | 12/2011 |
| JP | 2012059943 | 3/2012 |
| JP | 2013508980 | 3/2013 |
| WO | 9403922 | 2/1994 |
| WO | 0025363 | 5/2000 |
| WO | 0025365 | 5/2000 |
| WO | 0042665 | 7/2000 |
| WO | 0051167 A | 8/2000 |
| WO | 0065646 A | 11/2000 |
| WO | 02/099909 | 12/2002 |
| WO | 2005065385 | 7/2005 |
| WO | 2006127914 | 11/2006 |
| WO | WO2007021701 | 2/2007 |
| WO | 2007129261 | 11/2007 |
| WO | WO2009026174 | 2/2009 |
| WO | 2011050115 A2 | 4/2011 |

OTHER PUBLICATIONS

K Imai et al., "Decrease in Trenched Surface Oxide Leakage Currents by Rounding Off Oxidation", Extended Abstracts of the 18th (1986 International) Conference on Solid State Devices and Materials, Tokyo 1986, pp. 303-306.

(56) References Cited

OTHER PUBLICATIONS

Y. Baba et al., "High Reliable UMOSFET with Oxide-Nitride Complex Gate Structure" 1997 IEEE, pp. 369-372.
Initial Publication with ISR, Nov. 7, 2013, International application No. PCT/US2013/038956, Korean Intellectual Property Office, Republic of Korea.
Initial Publication with ISR, Nov. 7, 2013, International application No. PCT/US2013/038957, Korean Intellectual Property Office, Republic of Korea.

* cited by examiner

STRUCTURES AND METHODS OF FABRICATING DUAL GATE DEVICES

RELATED APPLICATION

This application claims priority to the U.S. Provisional Patent Application with Ser. No. 61/309,824, filed Mar. 2, 2010, entitled "Structures and Methods of Fabricating Dual Gate MIS Devices," which is hereby incorporated by reference in its entirety.

BACKGROUND

To conserve power, it is important to reduce power losses in transistors. In a metal oxide semiconductor field effect transistor (MOSFET) device, power losses can be reduced by reducing the device's drain-to-source on-resistance.

In order to achieve a high breakdown voltage in a MOS device, the epitaxial (epi) layer and/or resistivity can be increased, but this can detrimentally affect on-resistance. To alleviate that problem, a modulated electric field that is vertical to the direction of the current when the device is off can be introduced. A modulated electric field in the drift region increases the breakdown voltage and allows for higher doping concentration for a given breakdown voltage relative to a more conventional MOS device. One way to generate such an electric field is to include a "split gate" alongside the drift region. In a split gate structure, a MOS structure (e.g., trench) is created alongside the drift region. A shielded polysilicon (poly) region, which is connected to the source, is placed under the gate poly inside the trench, and the gate structure is built on top of the trench. Split gate structures offer a number of advantages, including better switching and breakdown voltage and lower on-resistance, but are difficult to manufacture.

SUMMARY

Accordingly, an improved fabrication method, and a device that lends itself to the improved method and provides advantages such as those associated with split gate devices, would be valuable.

In one embodiment according to the invention, first polysilicon (poly-1) is deposited into deep trenches that have been formed in a substrate. A first polysilicon polishing process is performed to planarize the exposed surfaces of the poly-1 so that the surfaces are flush with adjacent surfaces. Then, shallow trenches are formed in the substrate between the deep trenches, and second polysilicon (poly-2) is deposited into the shallow trenches. A second polysilicon polishing process is performed to planarize the exposed surface of the poly-2 so that the surface is flush with adjacent surfaces.

More specifically, in one embodiment, a first oxide layer is formed inside the deep trenches and over the mesas between the deep trenches, and then poly-1 is deposited into the deep trenches. A first polysilicon polishing process is performed to remove at least some of the poly-1, and an oxide polishing process is also performed to remove at least some of the first oxide layer from over the mesa, to form an even surface. After the first polysilicon polishing and oxide polishing processes, shallow trenches are formed in the mesa between the deep trenches. A second oxide layer is formed inside the shallow trenches and over the mesas between the deep and shallow trenches. Poly-2 is then deposited into the shallow trenches. A second polysilicon polishing process is performed to remove at least some of the poly-2.

A first metal contact to the poly-1 and a second metal contact to the poly-2 can then be formed. The first metal contact is directly over and in contact with the poly-1, and the second metal contact is directly over and in contact with the poly-2. In one embodiment, the first metal contact is part of a first metal layer and the second metal contact is part of a second metal layer, where the first and second metal layers are in the same surface plane but are physically isolated from one another.

Accordingly, in one embodiment, a semiconductor device—e.g., a dual gate structure—is formed. Such a device includes source trenches and gate trenches formed parallel to one another in alternating fashion in a substrate. The gate trenches are shallower than the source trenches. A source contact is coupled to poly-1 in the source trenches at one end of the source trenches. The source contact is directly over and in contact with the surfaces of the poly-1. A gate contact is coupled to poly-2 in the gate trenches at one end of the gate trenches (the source and gate contacts are formed at opposite ends of the trenches). The gate contact is directly over and in contact with the surfaces of the poly-2. As a result of the first and second polysilicon polishing processes, the surfaces of the poly-1 and poly-2 are flush with adjacent surfaces (e.g., flush with the mesas formed by the gate and source trenches). The source contact is part of a first metal layer and the gate contact is part of a second metal layer. The first and second metal layers are physically isolated from one another and in the same surface plane.

In one embodiment, the first and second polysilicon polishing processes and the oxide polishing process are chemical mechanical polishing (CMP) processes. The use of CMP facilitates the manufacture of devices such as dual gate structures. The use of CMP allows for planarization of the polysilicon inside the source and gate trenches and the oxide at the top of each source trench, which results in better control over the structure and improved process margins, thereby improving performance. For example, planarization improves the depth of focus during photolithography. As a result, material can be deposited more accurately and uniformly, and shallower trenches can be formed. Consequently, device features can be scaled to smaller dimensions.

These and other objects and advantages of the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification.

DETAILED DESCRIPTION

Figure 1:
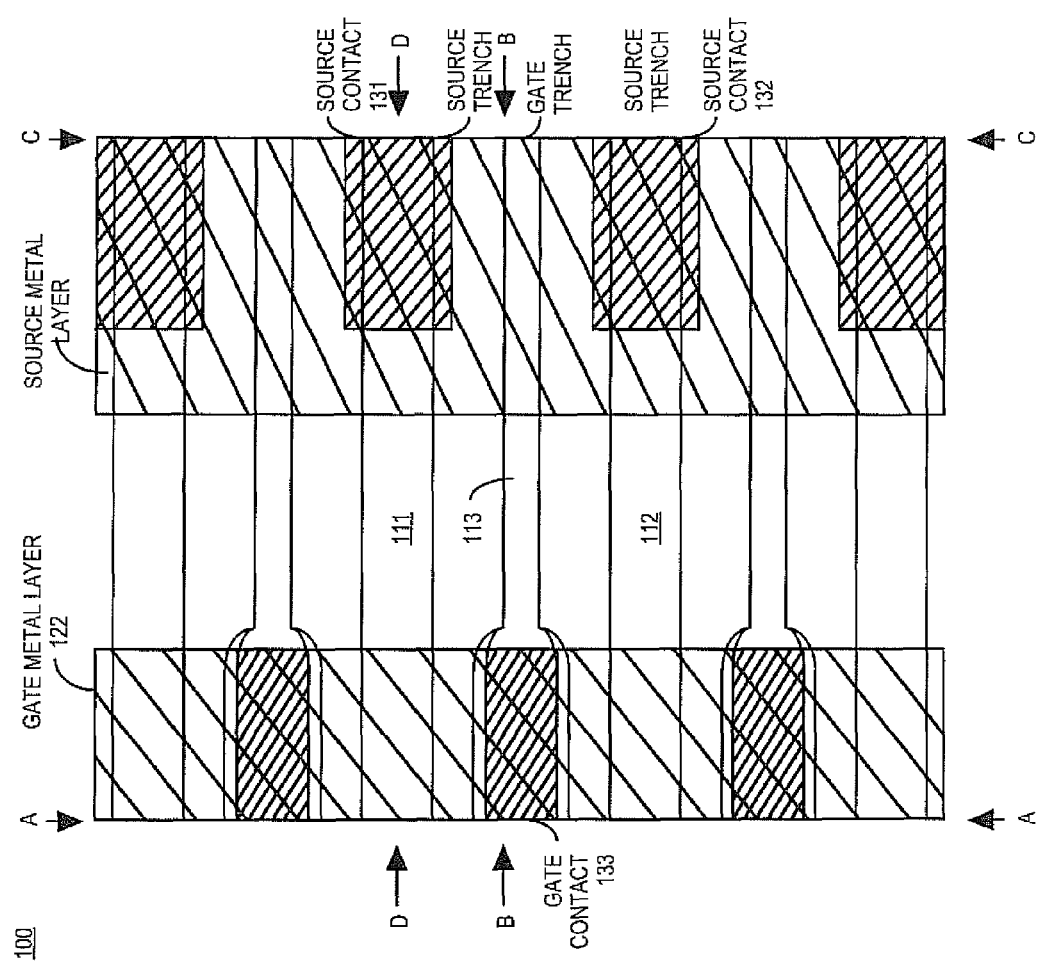
FIG. 1 is a top-down view of one embodiment of a semiconductor device in accordance with the present invention.

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "performing," "producing," "depositing," "growing," "etching" or the like, refer to actions and processes of semiconductor device fabrication.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the present invention can be implemented in conjunction with these other (perhaps conventional) processes and steps without significantly perturbing them. Generally speaking, embodiments in accordance with the present invention can replace portions of a conventional process without significantly affecting peripheral processes and steps.

As used herein, the letter "n" refers to an n-type dopant and the letter "p" refers to a p-type dopant. A plus sign "+" or a minus sign "−" may be used to represent, respectively, a relatively high or relatively low concentration of the dopant.

Some of the figures are discussed in the context of one type of device; however, embodiments according to the present invention are not so limited. That is, the features described herein can be utilized in either an n-channel device or a p-channel device. The discussion of one type of device can be readily mapped to another type of device by substituting p-type dopant and materials for corresponding n-type dopant and materials, and vice versa.

FIG. 1 is a top-down view of one embodiment of a semiconductor device 100 in accordance with the present invention. The semiconductor device 100 may be generally referred to as a dual gate structure. The semiconductor device 100 may be implemented as a metal-insulator-semiconductor (MIS) device.

In FIG. 1, multiple levels or layers of the semiconductor device 100 are illustrated. The structure illustrated in FIG. 1 includes a number of parallel trenches exemplified by the first trench 111 and the second trench 112, known as source trenches. A third trench 113, known as a gate trench, is between and parallel to the first and second trenches. There may be any number of source trenches, with a gate trench between each pair of source trenches. As described below, the trenches 111, 112, and 113 may be lined with an oxide and then filled with, for example, polysilicon.

A first metal layer 121 is formed over one end of the trenches, and a second metal layer 122 is formed over the other end of the trenches, as shown in FIG. 1. The first and second metal layers are in the same surface plane but are physically isolated from one another.

The first metal layer 121 is known as the source metal layer. The source metal layer 121 is in contact with the polysilicon in the source trenches 111 and 112 at the locations identified as 131 and 132. Contact between the source metal layer 121 is directly over the polysilicon in the source trenches.

The second metal layer 122 is known as the gate metal layer. The gate metal layer 122 is in contact with the polysilicon in the gate trench 113 at the location identified as 133. Contact between the gate metal layer 122 is directly over the polysilicon in the gate trenches. In one embodiment, the widths of the gate trenches are greater at the ends of the trenches that are under the second metal layer 122. That is, the gate trenches flare outward where they make contact with the gate metal layer. The gate trenches are wider than the gate contact, as shown in FIG. 1.

Figure 2:
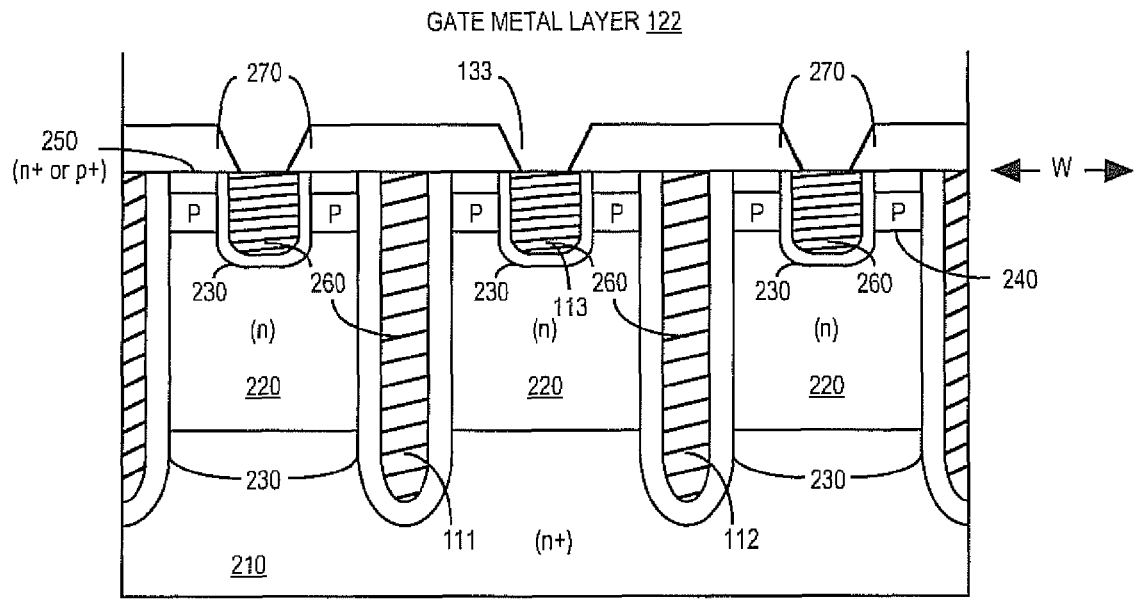
FIGS. 2, 3, 4, 5, and 6 are cross-sectional views along various axes showing elements of a semiconductor device according to embodiments of the present invention.

FIG. 2 is a cross-sectional view along the cut line A-A shown in FIG. 1. The portion of the structure 100 shown in FIG. 2 includes source trenches 111 and 112, as well as additional source trenches (not labeled), and gate trench 113, as well as additional gate trenches (not labeled).

In the FIG. 2 embodiment, the source and gate trenches are formed in a laminate or substrate that includes an n+ region 210 and an n-doped epitaxial region 220. The source trenches are deeper than the gate trenches; the source trenches extend through the epitaxial region 220 and into the n+ region 210, while the gate trenches do not.

The source and gate trenches may be lined with an oxide layer 230. P-body regions, such as p-body region 240, may also be formed in the substrate between the source and gate trenches. Source regions, such as source region 250, may also be formed in the substrate between the source and gate trenches. A drain region (not shown) may be implemented as a layer below the n+ region 210.

Figure 3:
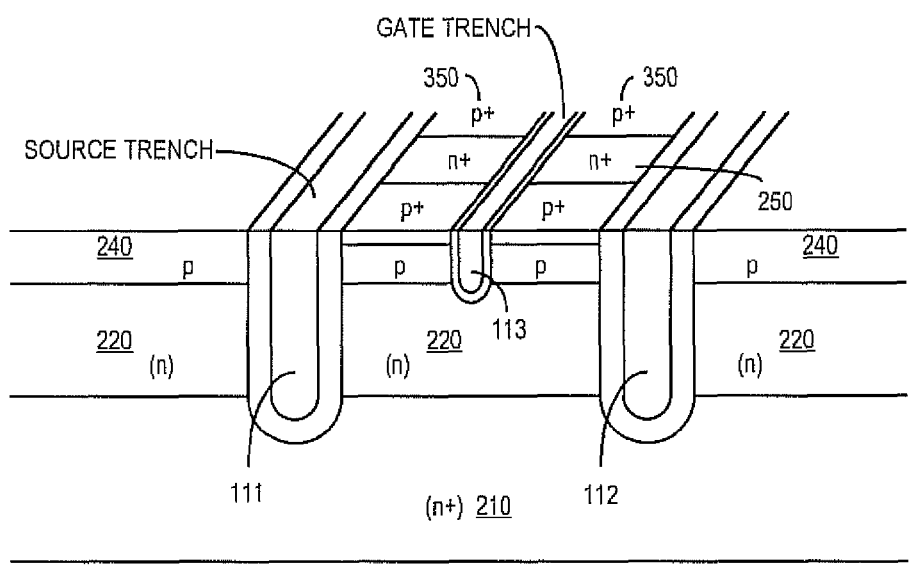

In the example of FIG. 2, the source regions are continuous n+ regions. However, in one embodiment, the n+ source regions are separated by p+ regions 350, as shown in FIG. 3. The n+ source regions 250 and p+ regions 350 alternate with one another as shown in FIG. 3. That is, n+ source regions 250 are located between p+ regions 350, and p+ regions are located between n+ source regions. The p+ regions 350 are used to provide electrical contact to the p-body regions 240. Accordingly, the same source metal layer can be in electrical contact with both the p+ body regions 240 (via the p+ regions 350) and the n+ source regions 250.

As will be discussed in more detail below, the top surfaces of the polysilicon 260 (FIG. 2) in the source and gate trenches, and the exposed surfaces of the oxide layers 230 at the top of the source trenches, are flush with the mesas that are between the trenches. This provides a number of benefits, also discussed below.

At the end of the structure 100 shown in FIG. 2 (that is, in the region that is under the gate metal layer 122; see FIG. 1), oxide regions 270 are formed over the source trenches and over the mesas between the source trenches and the gate trenches, but not over the gate trenches, leaving the polysilicon 260 in the gate trenches exposed to the gate metal layer 122. Accordingly, the gate metal layer 122 can make physical and electrical contact with the polysilicon in the gate trenches, as exemplified by the gate metal contact at 133.

Figure 4:
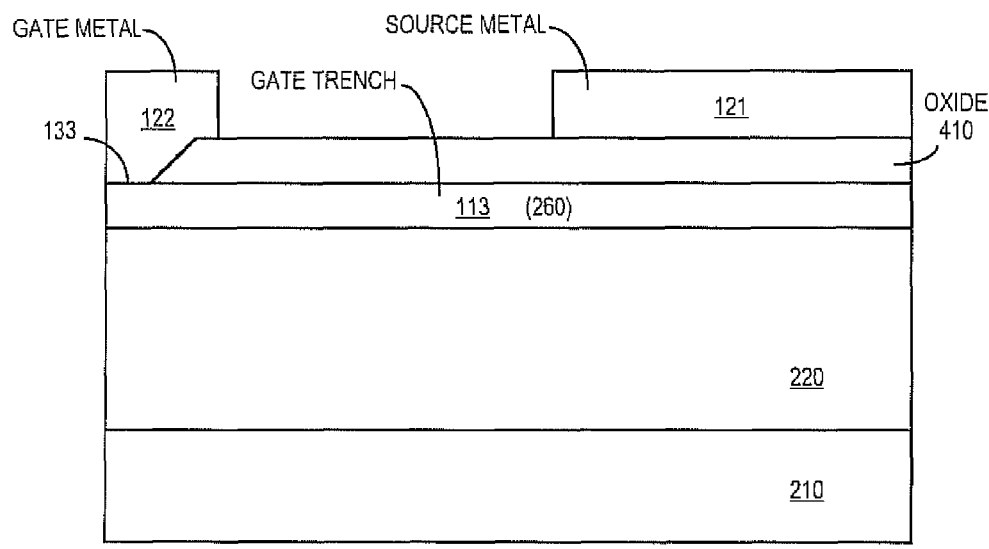

FIG. 4 is a cross-sectional view along the cut line B-B shown in FIG. 1. The portion of the structure 100 shown in FIG. 4 includes the gate trench 113, source metal layer 121, gate metal layer 122, epitaxial region 220, and n+ region 210. The source and gate metal layers are in the same surface plane.

An oxide layer 410 covers the gate trenches except for a portion of the gate trenches that is under the gate metal layer 122, leaving the polysilicon 260 in the gate trenches exposed to the gate metal layer. Accordingly, the gate metal layer 122 can make physical and electrical contact with the polysilicon 260 in the gate trenches, as exemplified by the gate metal contact at 133.

Figure 5:
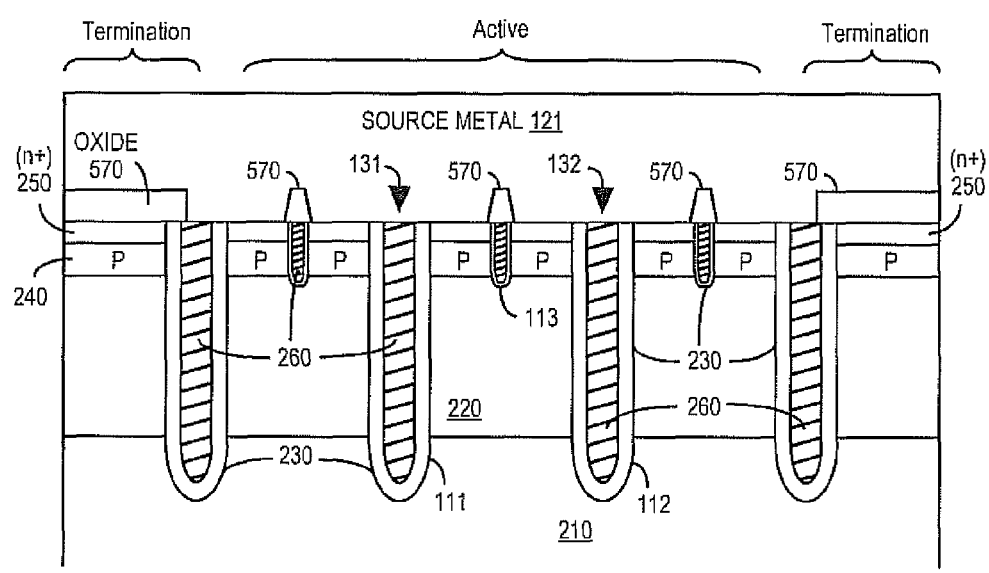

FIG. 5 is a cross-sectional view along the cut line C-C shown in FIG. 1. The portion of the structure 100 shown in FIG. 5 includes source trenches 111 and 112, as well as additional source trenches (not labeled), and gate trench 113, as well as additional gate trenches (not labeled).

As will be discussed in more detail below, the top surfaces of the polysilicon 260 in the source and gate trenches, and the exposed surfaces of the oxide layers 230, are flush with the mesas that are between the trenches. This provides a number of benefits, also discussed below.

At the end of the structure 100 shown in FIG. 5 (that is, in the region that is under the source metal layer 121; see FIG. 1), oxide regions 570 are formed over the gate trenches but not over the source trenches. Also, the oxide regions 570 are formed over the n+ source regions in the termination regions, but not over the n+ source regions in the active region. As a result, the polysilicon 260 in the source trenches, and the n+ source regions (e.g., n+ source region 250) in the active region, are exposed to the source metal layer 121. Accordingly, the source metal layer 121 can make physical and electrical contact with the polysilicon in the source trenches and with the n+ source regions, as exemplified by the source metal contact at 131 and 132.

Figure 6:
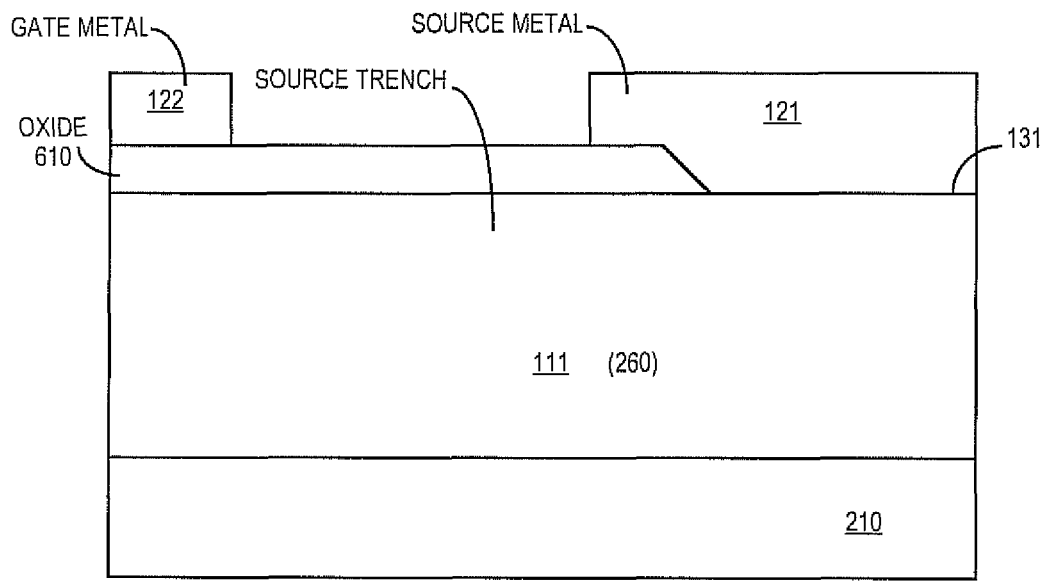

FIG. 6 is a cross-sectional view along the cut line D-D shown in FIG. 1. The portion of the structure 100 shown in FIG. 6 includes the source trench 111, source metal layer 121, gate metal layer 122, and n+ region 210. The source and gate metal layers are in the same surface plane.

An oxide layer 610 covers the source trenches except for a portion of the trenches that is under the source metal layer 121, leaving the polysilicon 260 in the source trenches exposed to the source metal layer. Accordingly, the source metal layer 121 can make physical and electrical contact with the polysilicon 260 in the source trenches, as exemplified by the source metal contact at 131.

Figure 7A:
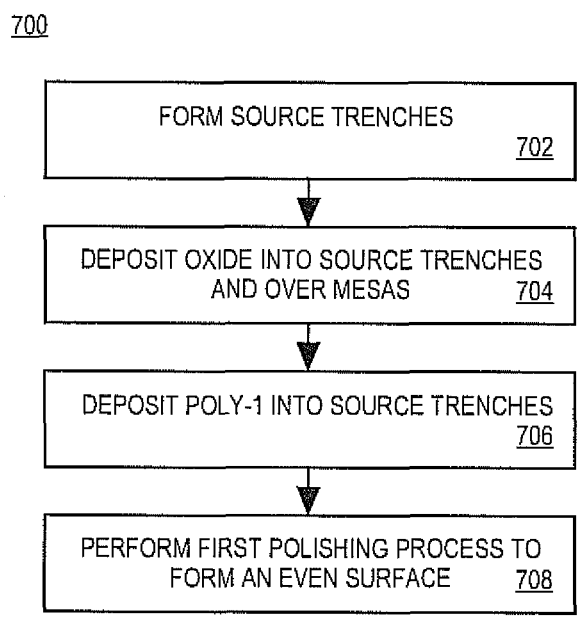
FIGS. 7A and 7B illustrate a flowchart of a process that is used to fabricate semiconductor devices according to embodiments of the present invention.
Figure 7B:
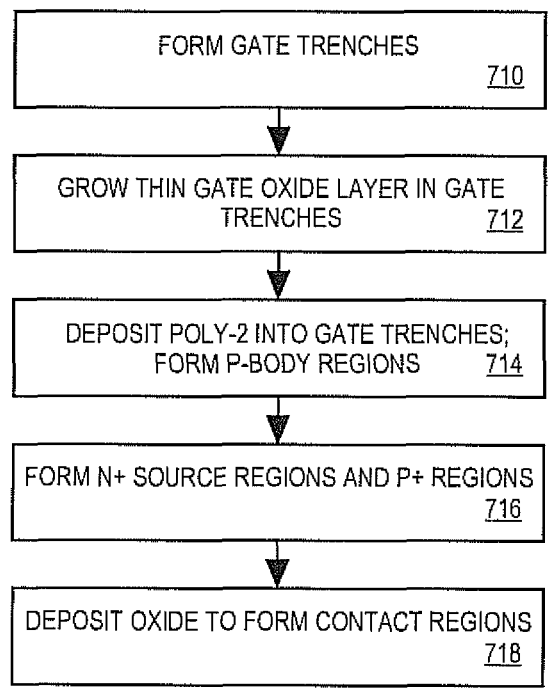

FIGS. 7A and 7B illustrate a flowchart 700 of one embodiment of a process that is used in the fabrication of semiconductor devices such as the device partially illustrated in FIG. 1. Although specific steps are disclosed in the flowchart 700, such steps are exemplary. That is, embodiments according to the present invention are well suited to performing various other steps or variations of the steps recited in the flowchart 700. The flowchart 700 is discussed in conjunction with FIGS. 8-17, which are cross-sectional views showing selected stages in the fabrication of a semiconductor device according to an embodiment of the present invention. Certain well-known stages are left out of the following discussion. For example, operations associated with the formation and removal of masks are not described.

Figure 8:
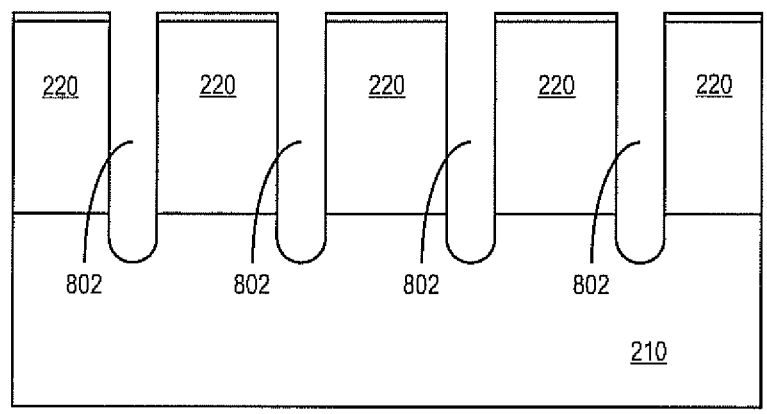
FIGS. 8, 9, 10, 11, 12, 13, 14, 15, 16, and 17 are cross-sectional views showing selected stages in the fabrication of a semiconductor device according to embodiments of the present invention.

In block 702 of FIG. 7, with reference also to FIG. 8, trenches 802 are formed in a substrate/laminate that includes n+ region 210 and epitaxial region 220. An etching process may be used to form the trenches 802. The trenches 802 are used as source trenches.

Figure 9:
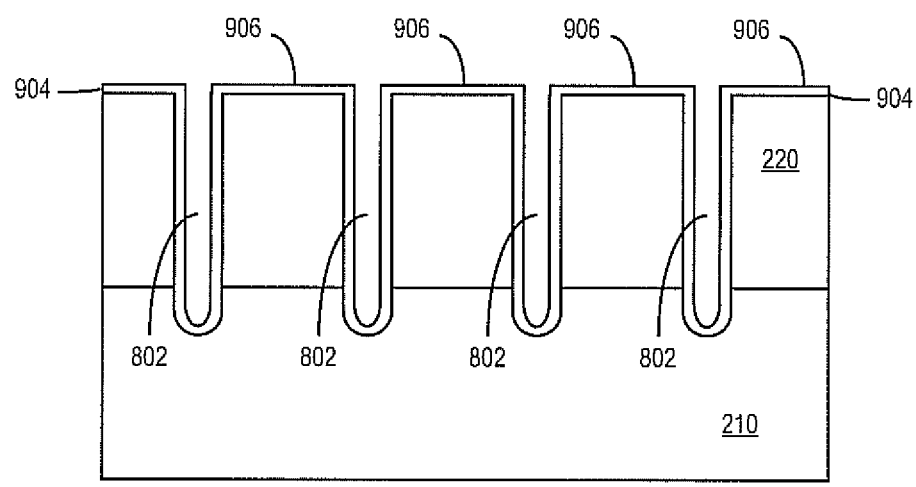

In block 704, with reference also to FIG. 9, an oxide layer 904 is deposited along the sidewalls and bottoms of the trenches 802, and also over the mesas 906 between those trenches.

Figure 10:
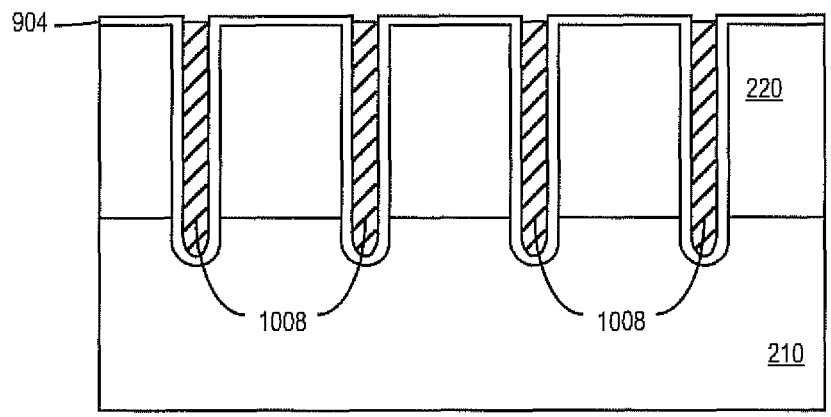

In block 706, with reference also to FIG. 10, polysilicon 1008 (poly-1) is deposited into the trenches 802. Each trench may be overfilled with poly-1. In one embodiment, a first polysilicon polishing process (e.g., CMP) is used to polish the poly-1 to form a flat surface. The poly-1 can then be etched back (e.g., in plasma) so that it is recessed relative to the adjacent oxide layer 904.

Figure 11:
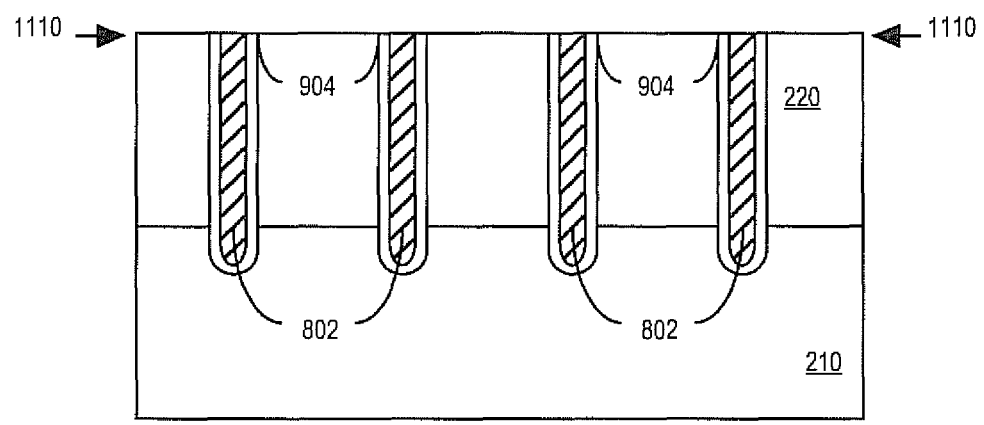

In block 708, with reference also to FIG. 11, an oxide polishing process (e.g., CMP) is used to form an even (flat and smooth) surface 1110. Specifically, the oxide layer 904 over the mesas is removed, so that exposed surfaces of the oxide layer (the ends of the remainder of the oxide layer 904, along the sidewalls of the trenches 802) are flush with the adjacent surfaces/mesas. Also, any portions of the poly-1 protruding from the trenches 802 are removed, so that the exposed surfaces of the poly-1 are also flush with the adjacent surfaces/mesas.

During the oxide polishing (e.g., CMP) process, additional oxide may be added by deposition and removed during the oxide CMP process to achieve a surface 1110 that is both flat and smooth. It is beneficial for the surface 1110 to be free from imperfections (e.g., dips, pits, and scratches) to the extent practical. In a later process stage (block 712), polysilicon (poly-2) is deposited into the trenches used as gate trenches; that poly-2 may be captured in an imperfection, potentially forming stringers, if the surface 1110 is not as flat and smooth as practical.

Figure 12:
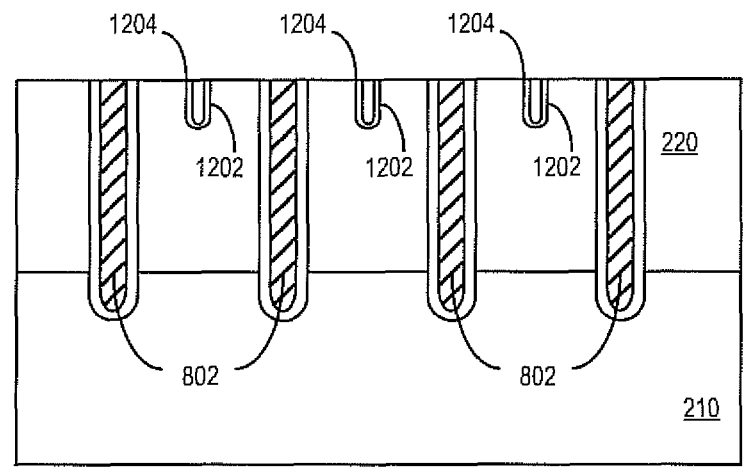

In block 710, with reference to FIG. 12, trenches 1202 are formed in the substrate. An etching process may be used to form the trenches 1202. The trenches 1202 are used as gate trenches and are shallower than the source trenches (trenches 802). At one end of the trenches 1202—at the end of the trenches at which the gate metal contacts are formed—the trenches 1202 are widened, as shown in FIG. 1.

In block 712, with reference also to FIG. 12, a thin gate oxide layer 1204 is grown along the sidewalls and bottoms of the trenches 1202, and also over the mesas 906 (FIG. 9) between the trenches 1202 and the trenches 802.

Figure 13:
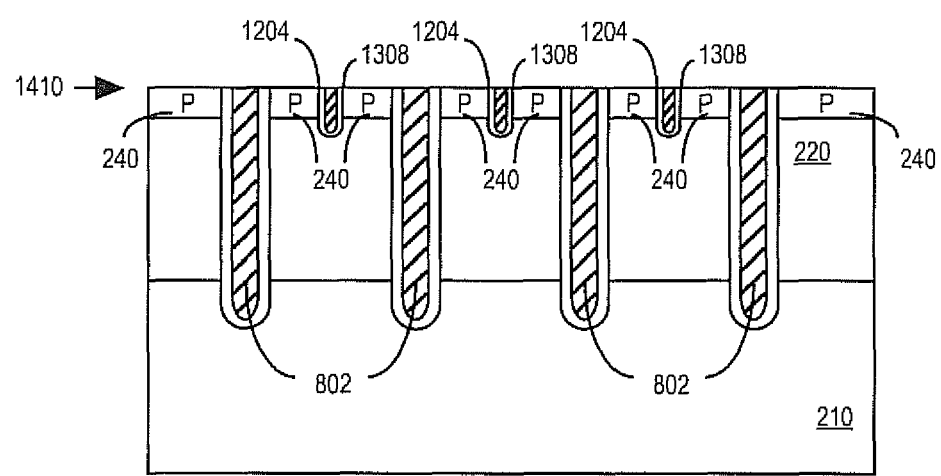

In block 714, with reference to FIG. 13, polysilicon 1308 (poly-2) is deposited into the trenches 1202. Each trench may be overfilled with poly-2, in which case a second polysilicon polishing process (e.g., CMP) is used to again generate a flat surface. The poly-2 can then be etched back (e.g., in plasma) so that it is recessed relative to the adjacent oxide layer.

With reference still to FIG. 13, in one embodiment, p-body regions 240 can be formed in the regions between the trenches 802 and 1202.

Figure 14:
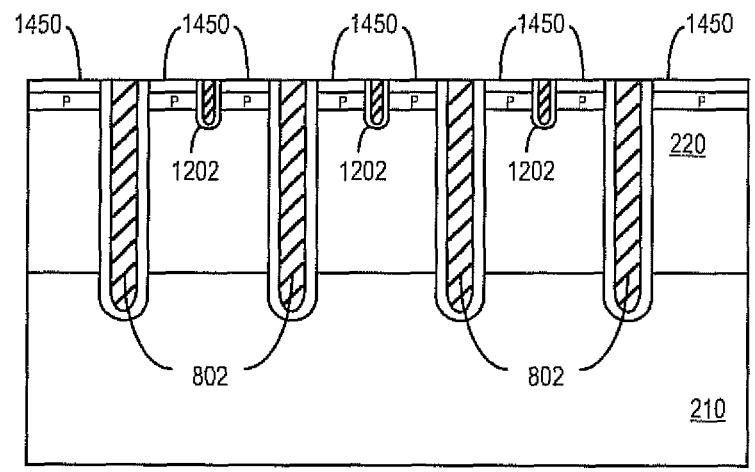

In block 716, with reference also to FIG. 14, regions 1450 are formed in the regions between the trenches 802 and 1202. As described above in conjunction with FIG. 3, the regions 1450 include alternating n+ source regions 250 and p+ regions 350. That is, the n+ source regions 250 and the p+ regions 350 alternate with one another as shown in FIG. 3.

Figure 15:
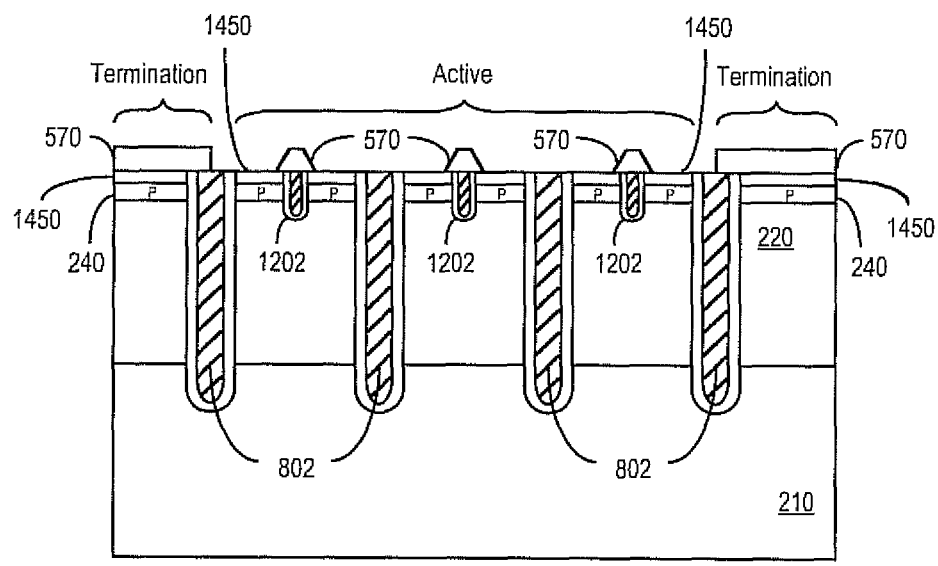

In block 718, with reference also to FIG. 15, oxide 570 is deposited in selected locations in the source metal region. Specifically, an oxide layer is deposited, then selectively removed so that, in the source metal region, the oxide 570 remains in the termination regions and over the gate trenches 1202, leaving the regions 1450 (e.g., the alternating n+ source regions 250 and p+ regions 350) exposed in the active region and the source trenches 802 exposed in the termination and active regions.

Figure 16:
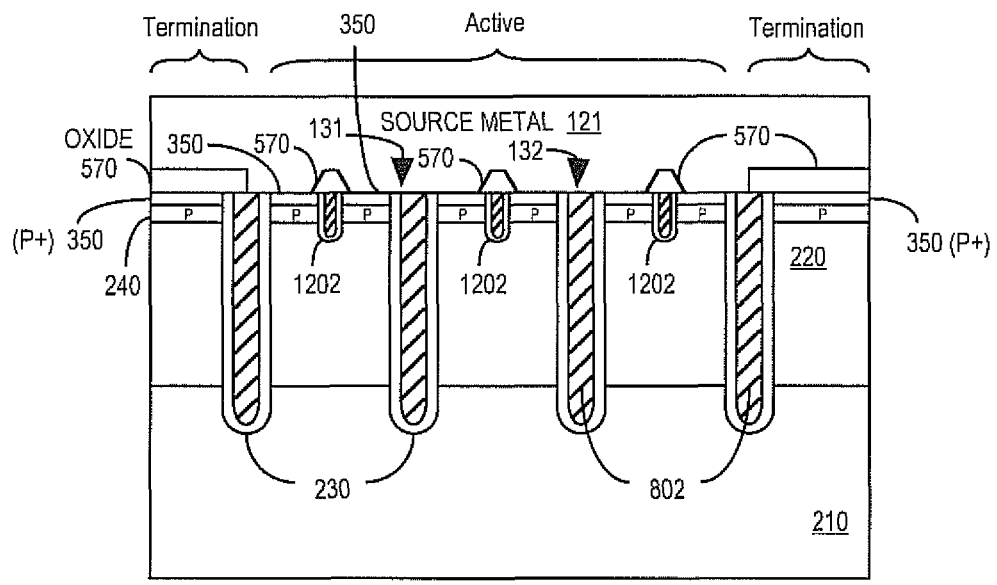

Consequently, when the source metal layer 121 is subsequently deposited, physical and electrical contact to the source trenches 111 and 112 and to the n+ source regions 250 is made, as shown in FIG. 5. Also, when the source metal layer 121 is subsequently deposited, electrical and physical contact to the p+ regions 350, and hence electrical contact to the p-body regions 240, is made, as shown in FIG. 16. Thus, the same source metal layer makes electrical contact to both the n+ source regions 250 and the p-body regions 240.

Figure 17:
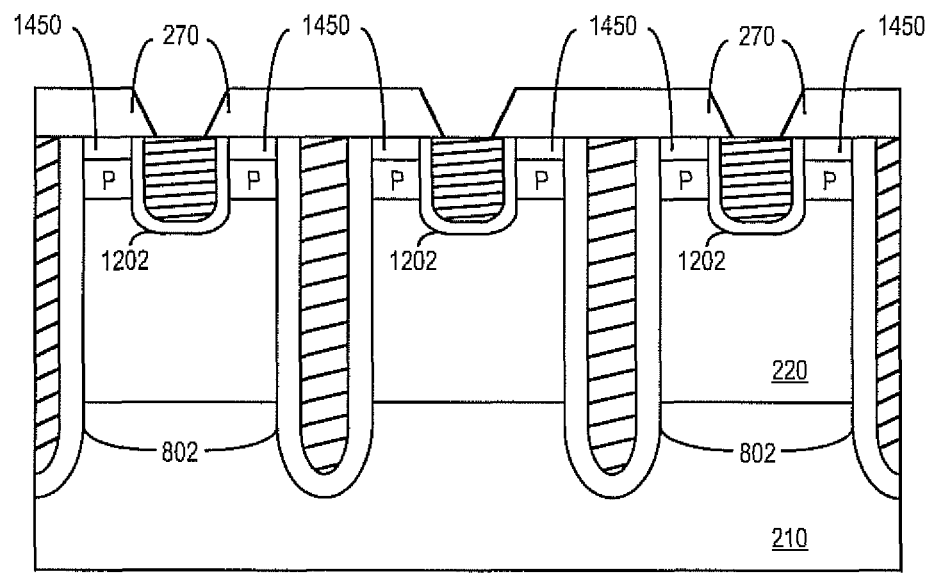

Also, with reference to FIG. 17, oxide 270 is deposited in selected locations in the gate metal region. Specifically, an oxide layer is deposited, then selectively removed so that, in the gate metal region, the oxide 270 remains over the source trenches 802 and over the regions 1450 (n+ source regions 250 and p+ regions 350), leaving the gate trenches 1202 exposed. Consequently, when the gate metal layer 122 is subsequently deposited, physical and electrical contact to the gate trenches is made, as shown in FIG. 2. The width of the gate trench (measured in the direction 'W') is less than the width of the contact of the gate trench with the gate metal layer 122.

In summary, embodiments in accordance with the present invention pertain to structures of, and methods of fabricating, trench-gated devices (e.g., MIS devices) incorporating dual gate structures that have separated polysilicon layers inside independent gate and source trenches that are respectively coupled. The dual gate structures are implemented with a gate contact connecting the gate polysilicon (poly-2) layer in the gate trench to a gate electrode, and a source contact connecting the source polysilicon (poly-1) layer in the source trench to a source electrode. The source contact and the gate contact are at the same surface plane.

CMP is used to facilitate the manufacture of such devices. The use of CMP allows for planarization of the polysilicon inside the source and gate trenches and the oxide at the top of each source trench, which results in better control over the structure and improved process margins, thereby improving performance. For example, planarization improves the depth of focus during photolithography. As a result, material can be deposited more accurately and uniformly, and shallower trenches can be formed. Consequently, device features can be scaled to smaller dimensions.

Embodiments in accordance with the invention can be used with medium voltage rating (60-150 volts) trench power MOS devices and high voltage rating (150-300 volts) trench power MOS devices.

In summary, embodiments of semiconductor devices, and embodiments of methods for fabricating such devices, are described. The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of fabricating a dual gate semiconductor device, said method comprising:
    depositing oxide into a first trench and into a second trench that are formed in a substrate, said oxide also deposited over a mesa that is between said first trench and said second trench;
    depositing first polysilicon into said first trench and into said second trench;
    performing a first polysilicon polishing process to planarize the exposed upper surfaces of said first polysilicon so that, after said first polysilicon polishing process, exposed surfaces of said first polysilicon are flush with the surface of said oxide;
    after said polysilicon polishing process, performing an oxide polishing process to remove said oxide from over said mesa and further remove part of said first polysilicon so that, after said oxide polishing process, exposed surfaces of said first polysilicon are flush with said mesa;
    after said first polysilicon polishing process, forming a third trench in said substrate between said first and second trenches, wherein said third trench is shallower than said first and second trenches;
    depositing second polysilicon into said third trench;
    performing a second polysilicon polishing process to planarize an exposed surface of said second polysilicon so that said surface is flush with adjacent surfaces; and
    forming a first metal contact to said first polysilicon and a second metal contact to said second polysilicon.

2. The method of claim 1 wherein said first and second polysilicon polishing processes and said oxide polishing process comprise chemical mechanical polishing processes.

3. The method of claim 1 wherein said first metal contact is directly over and in contact with said first polysilicon, and said second metal contact is directly over and in contact with said second polysilicon.

4. The method of claim 1 wherein said first metal contact is part of a first metal layer and said second metal contact is part of a second metal layer, wherein said first and second metal layers are in the same surface plane but are physically isolated from one another.

5. The method of claim 1 wherein said third trench is wider than said second metal contact.

6. The method of claim 1 wherein said first, second, and third trenches are parallel to one another.

7. The method of claim 1 wherein said first metal contact is at a first end of said first trench and at a first end of said second trench, and wherein said second metal contact is at a first end of said third trench, wherein said first end of said third trench is at the opposite end of said third trench relative to said first end of said first trench and said first end of said second trench.

8. The method of claim 7 wherein said first end of said third trench is wider than a second end of said third trench.

9. The method of claim 1 wherein said exposed surfaces of said first polysilicon after said oxide polishing process is performed and said surface of said second polysilicon after said second silicon polishing process is performed are flush with surfaces of mesas between said first, second, and third trenches.

10. The method of claim 1 wherein said first and second trenches are lined with first oxide layers and said third trench is lined with a second oxide layer, wherein surfaces of said first oxide layers and said second oxide layer are flush with said exposed surfaces of said first polysilicon after said oxide polishing process is performed and said exposed surface of said second polysilicon after said second polysilicon polishing process is performed.

11. A method of fabricating a dual gate semiconductor device, said method comprising:
forming a first trench and a second trench in a substrate, said first and second trenches separated by a first mesa;
forming a first oxide layer inside said first and second trenches and over said first mesa, and then depositing first polysilicon into said first and second trenches;
performing a first polysilicon polishing process to remove at least some of said first polysilicon;
after said first polysilicon polishing process id performed, etching back the exposed upper surface of said first polysilicon so that it is recessed relative to said first oxide layer over said first mesa;
after said etching, performing an oxide polishing process to remove said first oxide layer from over said first mesa and any portion of said exposed upper surface of said first polysilicon protruding above said first mesa so that, after said oxide polishing process is performed, exposed surfaces of said first polysilicon are flush with said first mesa;
after said first polysilicon polishing process and after said oxide polishing process are performed, forming a third trench in said first mesa between said first and second trenches, said first and third trenches separated by a second mesa and said second and third trenches separated by a third mesa, wherein said third trench is shallower than said first and second trenches;
forming a second oxide layer inside said third trench and over said second and third mesas, and then depositing second polysilicon into said third trench; and
performing a second polysilicon polishing process to remove at least some of said second polysilicon.

12. The method of claim 11 further comprising forming a first metal contact to said first polysilicon and a second metal contact to said second polysilicon.

13. The method of claim 12 wherein said first metal contact is directly over and in contact with said first polysilicon and said second metal contact is directly over and in contact with said second polysilicon in said second trench.

14. The method of claim 12 wherein said first metal contact is part of a first metal layer and said second metal contact is part of a second metal layer, wherein said first and second metal layers are in the same surface plane but are physically isolated from one another.

15. The method of claim 12 wherein said second metal contact is narrower than said third trench.

16. The method of claim 11 wherein said first and second polysilicon polishing processes and said oxide polishing process comprise chemical mechanical polishing processes.

17. The method of claim 11 wherein said oxide polishing process further comprises depositing additional oxide prior to oxide polishing.

* * * * *